(12) United States Patent
Ju

(10) Patent No.: US 10,085,360 B2
(45) Date of Patent: Sep. 25, 2018

(54) HEAT SINK ASSEMBLY

(71) Applicant: Lintes Technology Co., Ltd, New Taipei (TW)

(72) Inventor: Ted Ju, New Taipei (TW)

(73) Assignee: LINTES TECHNOLOGY CO., LTD, New Taipei (TW)

( * ) Notice: Subject to any disclaimer, the term of this patent is extended or adjusted under 35 U.S.C. 154(b) by 0 days.

(21) Appl. No.: 15/646,514

(22) Filed: Jul. 11, 2017

(65) Prior Publication Data
US 2018/0014429 A1    Jan. 11, 2018

(30) Foreign Application Priority Data

Jul. 11, 2016 (CN) ..................... 2016 2 0770464 U

(51) Int. Cl.
*H05K 7/20* (2006.01)
*G06F 1/20* (2006.01)
(Continued)

(52) U.S. Cl.
CPC ......... *H05K 7/20154* (2013.01); *G06F 1/203* (2013.01); *H01R 12/7064* (2013.01);
(Continued)

(58) Field of Classification Search
CPC .. H01R 12/7064; H01R 12/721; H01R 12/722; H01R 12/73; H01R 13/533; H01R 13/665; H05K 7/1427; H05K 7/20145; H05K 7/20154; H05K 7/20163; H05K 7/2039; H05K 7/20436; H05K 7/20445; H05K 1/0203; H05K 5/0247; H05K 5/0286; H05K 2201/10325; H05K 2201/10356
See application file for complete search history.

(56) References Cited

U.S. PATENT DOCUMENTS 5,898,569 A * 4/1999 Bhatia .................... G06F 1/203
                                                          165/80.2
6,459,575 B1 * 10/2002 Esterberg ............... G06F 1/203
                                                          165/185
(Continued)

FOREIGN PATENT DOCUMENTS

| CN | 100410841 C | 8/2008 |
| TW | 201215302 A | 4/2012 |
| TW | 201618657 A | 5/2016 |

*Primary Examiner* — Robert J Hoffberg
(74) *Attorney, Agent, or Firm* — Locke Lord LLP; Tim Tingkang Xia, Esq.

(57) ABSTRACT

A heat sink assembly includes a casing having an opening, a main board accommodated in the casing, a heat sink mounted on the main board, an electrical connector mounted on the main board and exposed in the opening, a mating connector located outside the casing and connected to the electrical connector through the opening in a plugging manner, and a heat conductor, disposed inside the casing. The mating connector has a chip that is electrically connected to the electrical connector. One end of the heat conductor is connected to the heat sink, and the other end of the heat conductor is thermally connected to the electrical connector or the mating connector, so that heat generated by the chip during working can be transferred to the heat sink through the heat conductor, thereby reducing a temperature of the mating connector.

22 Claims, 16 Drawing Sheets

(51) Int. Cl.
  *H05K 1/02*    (2006.01)
  *H05K 7/14*    (2006.01)
  *H01R 12/70*   (2011.01)
  *H01R 12/72*   (2011.01)
  *H01R 12/73*   (2011.01)
  *H01R 13/533*  (2006.01)
  *H01R 13/66*   (2006.01)

(52) U.S. Cl.
  CPC ......... *H01R 12/721* (2013.01); *H01R 12/722* (2013.01); *H01R 12/73* (2013.01); *H01R 13/533* (2013.01); *H01R 13/665* (2013.01); *H05K 7/1427* (2013.01); *H05K 7/2039* (2013.01); *H05K 7/20445* (2013.01); *H05K 7/20163* (2013.01); *H05K 2201/10325* (2013.01); *H05K 2201/10356* (2013.01)

(56) References Cited

U.S. PATENT DOCUMENTS

| | | | | |
|---|---|---|---|---|
| 7,364,445 | B1* | 4/2008 | Ni | H05K 5/0278 |
| | | | | 439/140 |
| 7,375,967 | B2* | 5/2008 | Huang | G06F 1/1632 |
| | | | | 165/104.33 |
| 9,268,376 | B2* | 2/2016 | Winkler | G06F 1/203 |
| 9,515,427 | B2* | 12/2016 | Wu | H01R 13/7175 |
| 2012/0069522 | A1* | 3/2012 | Hung | H01L 23/34 |
| | | | | 361/700 |
| 2016/0143188 | A1* | 5/2016 | Kao | F04D 29/4226 |
| | | | | 165/80.2 |
| 2018/0014430 | A1* | 1/2018 | Lin | H01R 12/721 |

\* cited by examiner

HEAT SINK ASSEMBLY

CROSS-REFERENCE TO RELATED APPLICATION

This non-provisional application claims priority to and benefit of, under 35 U.S.C. § 119(a), Patent Application No. 201620770464.5 filed in P.R. China on Jul. 11, 2016, the entire content of which is hereby incorporated by reference.

FIELD OF THE INVENTION

The present invention relates to a heat sink assembly, and more particularly to a heat sink assembly capable of reducing a temperature of a cable connector.

BACKGROUND OF THE INVENTION

A common cable connector in the industry includes a circuit board, a plug electrically connected to one end of the circuit board, and a flexible flat cable, electrically connected to another end of the circuit board. Currently, because functions of an electronic device are increasingly powerful, signal transmission requirements on an electrical connector are increasingly high. In order to enable a cable connector to have a broader data transmission broadband and a capability of transmitting an uncompressed audio signal and a high-resolution video signal, a chip is usually mounted on a circuit board to enhance a decoding capacity of the cable connector. However, it is well known that the chip generates a great amount of heat during working, and if the heat cannot be dissipated in time, the chip would fail because of an extremely high temperature, which destroys the cable connector and causes the whole electronic device to fail.

Therefore, a heretofore unaddressed need exists in the art to address the aforementioned deficiencies and inadequacies.

SUMMARY OF THE INVENTION

In one aspect, the present invention relates to a heat sink assembly capable of connecting a mating connector to a heat sink inside a casing through a heat conductor, so as to reduce a temperature of the mating connector.

In certain embodiments, a heat sink assembly includes a casing having an opening, a main board accommodated in the casing, a heat sink mounted on the main board, an electrical connector mounted on the main board and exposed in the opening, a mating connector located outside the casing, and a heat conductive device disposed inside the casing. The mating connector is connected to the electrical connector through the opening in a plugging manner. The mating connector includes a chip, and the chip is electrically connected to the electrical connector. One end of the heat conducting device is connected to the heat sink, and another end thereof is thermally connected to the electrical connector or the mating connector, so that heat generated by the chip during working can be transferred to the heat sink through the heat conducting device, thereby reducing a temperature of the mating connector.

In certain embodiments, the heat conducting device includes a heat conductor and a metal member connected to the heat conductor, and a side of the metal member is in contact with the electrical connector.

In certain embodiments, the metal member includes a top surface and an extending portion formed by extending from the top surface in a direction toward the main board. The top surface presses the electrical connector and the heat conductor, and the extending portion is supported on the main board and is located between the heat conductor and the electrical connector.

In certain embodiments, the electrical connector includes an outer shell, the outer shell partially covers the mating connector, and the heat conducting device clings to the outer shell.

In certain embodiments, the electrical connector includes an outer shell, the outer shell has a notch, the mating connector is exposed in the notch, and the heat conducting device is in contact with the mating connector through the notch.

In certain embodiments, the heat conducting device includes a conducting portion. One end of the conducting portion is pressed on the heat sink, and another end thereof extends to form an open frame portion. The open frame portion is located outside the casing and surrounds the opening, the mating connector includes an outer metal shell, and the open frame portion tightly encloses the outer metal shell.

In certain embodiments, the mating connector includes an outer metal shell enclosing the chip, and the outer metal shell partially enters the casing through the opening and is conductively connected to the heat conducting device.

In certain embodiments, the mating connector includes an outer metal shell enclosing the chip, the heat conducting device includes a heat conductor connected to the heat sink, a metal member is connected to the heat conductor, an elastic piece is mounted on a surface of the metal member, and the elastic piece is located between the metal member and the outer metal shell and urges downward against the outer metal shell.

In certain embodiments, the elastic piece includes a plate portion clinging to a surface of the outer metal shell, and an elastic sheet formed from the plate portion in a tearing and bending manner, the surface of the outer metal shell is provided with a plurality of slots, and the elastic sheet enters one of the slots and urges against bottom surfaces of that slot.

In certain embodiments, the mating connector includes an outer metal shell enclosing the chip, the heat conducting device includes a conductive connecting portion that passes through the opening, and the conductive connecting portion is in contact with the outer metal shell.

In certain embodiments, the mating connector includes a plug and a circuit board connected to the plug, the plug is connected to the electrical connector in a plugging manner, the chip is mounted on the circuit board, an inner metal shell encloses the circuit board and is in contact with the plug, a cable is soldered to the circuit board, a spring is sleeved over an end of the cable, an end of the spring extends in a direction toward the inner metal shell to form a heat conducting portion, and the heat conducting portion is in contact with an outer surface of the inner metal shell.

In certain embodiments, the outer surface of the inner metal shell is provided with at least one protrusion, an outer metal shell encloses the inner metal shell, an inner surface of the outer metal shell is in contact with the protrusion, and an outer surface of the outer metal shell is provided with a plurality of slots.

In certain embodiments, the heat conducting device is formed by bending a copper tube, the casing includes a first sidewall and a second sidewall adjacent to the first sidewall, the opening is located on the first sidewall, the second sidewall is provided with a plurality of heat dissipation holes, and the heat sink is exposed in the heat dissipation holes.

In certain embodiments, the heat sink includes a fan, an air guide member covering the fan, and a cooling fin. The cooling fin is located on a side of the fan and presses the heat conducting device. The fan blows air to the cooling fin through the air guide member. The air guide member is provided with a circular mask portion. The mask portion covers on the fan. A top surface of the mask portion is provided with a plurality of air inlets. An air outlet is formed by extending from a side of the mask portion in a direction toward the cooling fin. The air inlets are circularly symmetrically disposed relative to a center of the top surface of the mask portion, widths thereof gradually reduce in a direction of approaching the center of the top surface of the mask portion, and the number of the air inlets is the same as the number of blades of the fan.

In another aspect, the present invention relates to a heat sink assembly. In certain embodiments, a heat sink assembly includes a casing having an opening, a main board accommodated in the casing, an electrical connector mounted on the main board and exposed in the opening, a mating connector at least partially disposed inside the casing, and a heat conducting device. The mating connector is connected to the electrical connector through the opening in a plugging manner. The mating connector includes a chip, and the chip is electrically connected to the electrical connector. The heat conducting device is thermally connected to the electrical connector or the mating connector, so that heat generated by the chip during working can be transferred into the casing through the heat conducting device, thereby reducing a temperature of the mating connector.

In certain embodiments, the mating connector includes an outer metal shell enclosing the chip, the heat conducting device is located inside the casing, and the outer metal shell partially enters the casing through the opening and is in contact with the heat conducting device.

In certain embodiments, the heat conducting device includes an elastic piece, and the elastic piece urges against the electrical connector or the mating connector.

In certain embodiments, the mating connector includes an outer metal shell enclosing the chip, the heat conducting device includes a heat conductor and a metal member connected thereto, and the elastic piece is mounted on the metal member and urges against the outer metal shell.

In certain embodiments, the elastic piece includes a plate portion clings to a surface of the outer metal shell, and an elastic sheet formed from the plate portion in a tearing and bending manner, the surface of the outer metal shell is provided with a plurality of slots, and the elastic sheet enters one of the slots and urges against bottom surfaces of the slot.

In certain embodiments, the mating connector includes an outer metal shell enclosing the chip, the mating connector includes a conductive connecting portion that passes through the opening and is in contact with the outer metal shell outside the casing.

In certain embodiments, the heat sink assembly further includes an elastic locking member. The elastic locking member includes a bolt, an elastic body sheathed on the bolt, and a nut located below the main board. The heat conducting device includes a through hole, the elastic body is located inside the through hole, and the elastic bolt passes through the through hole and the main board and is locked to the nut.

In certain embodiments, a heat sink is mounted on the main board or the casing and is connected to the heat conducting device, so that heat generated by the chip during working can be transferred to the heat sink through the heat conducting device, a wafer is mounted on the main board, and the heat conducting device is thermally connected to the wafer.

As compared with the related art, certain embodiments of the present invention have the following beneficial advantages:

In the present heat sink assembly, because an end of the heat conducting device is connected to the heat sink, and an another end thereof is thermally connected to the mating connector, so that heat generated by the mating connector during working can be transferred to the heat sink through the heat conducting device for dissipation, so as to prevent a temperature of the mating connector from being extremely high, ensure normal working of the chip in the mating connector, and improve working stability of the heat sink assembly.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
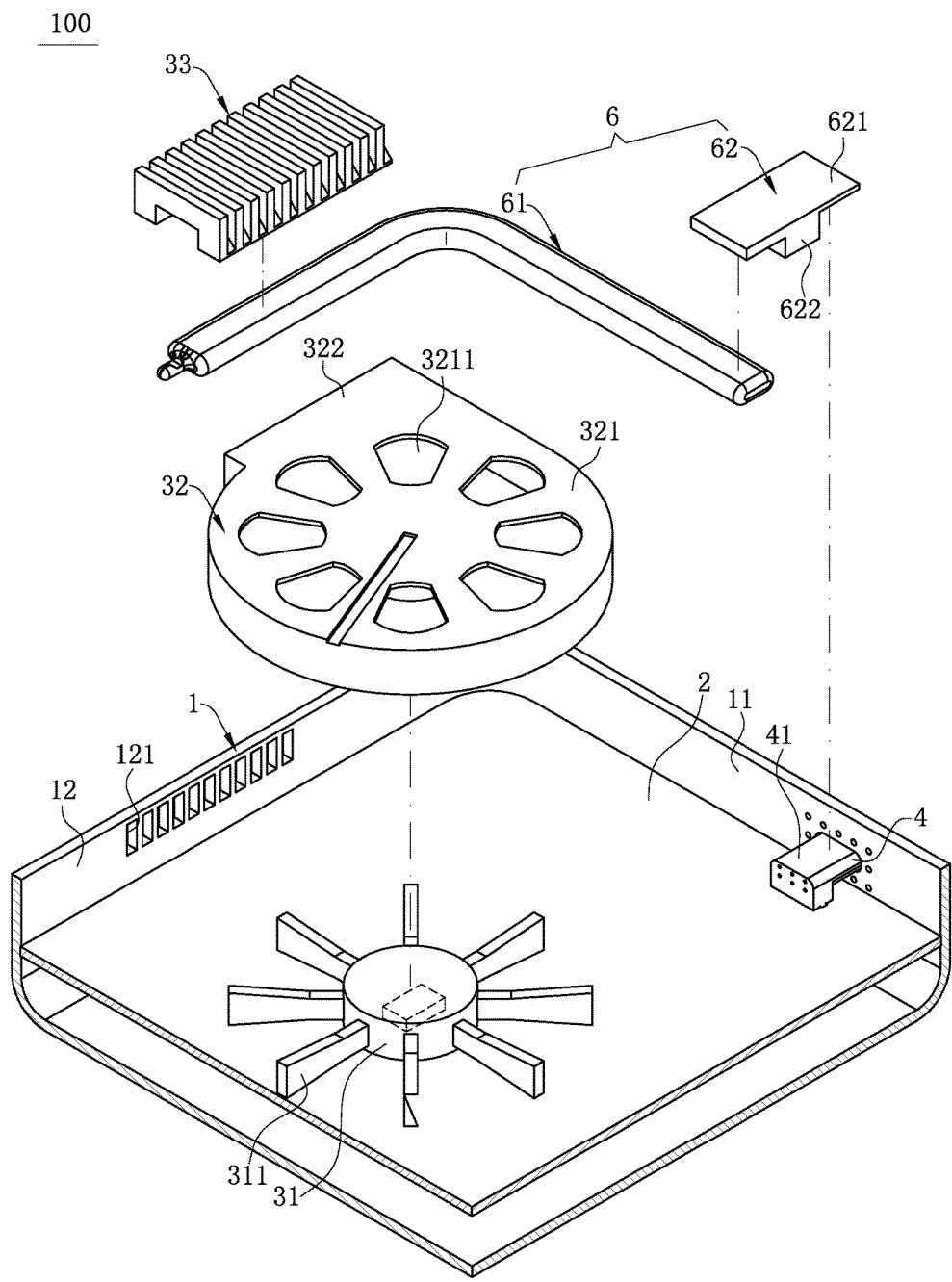
FIG. 1 is a schematic three-dimensional exploded view of a first embodiment of a heat sink assembly according to the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-14. In accordance with the purposes of this invention, as embodied and broadly described herein, this invention, in one aspect, relates to a heat sink assembly.

Figure 2:
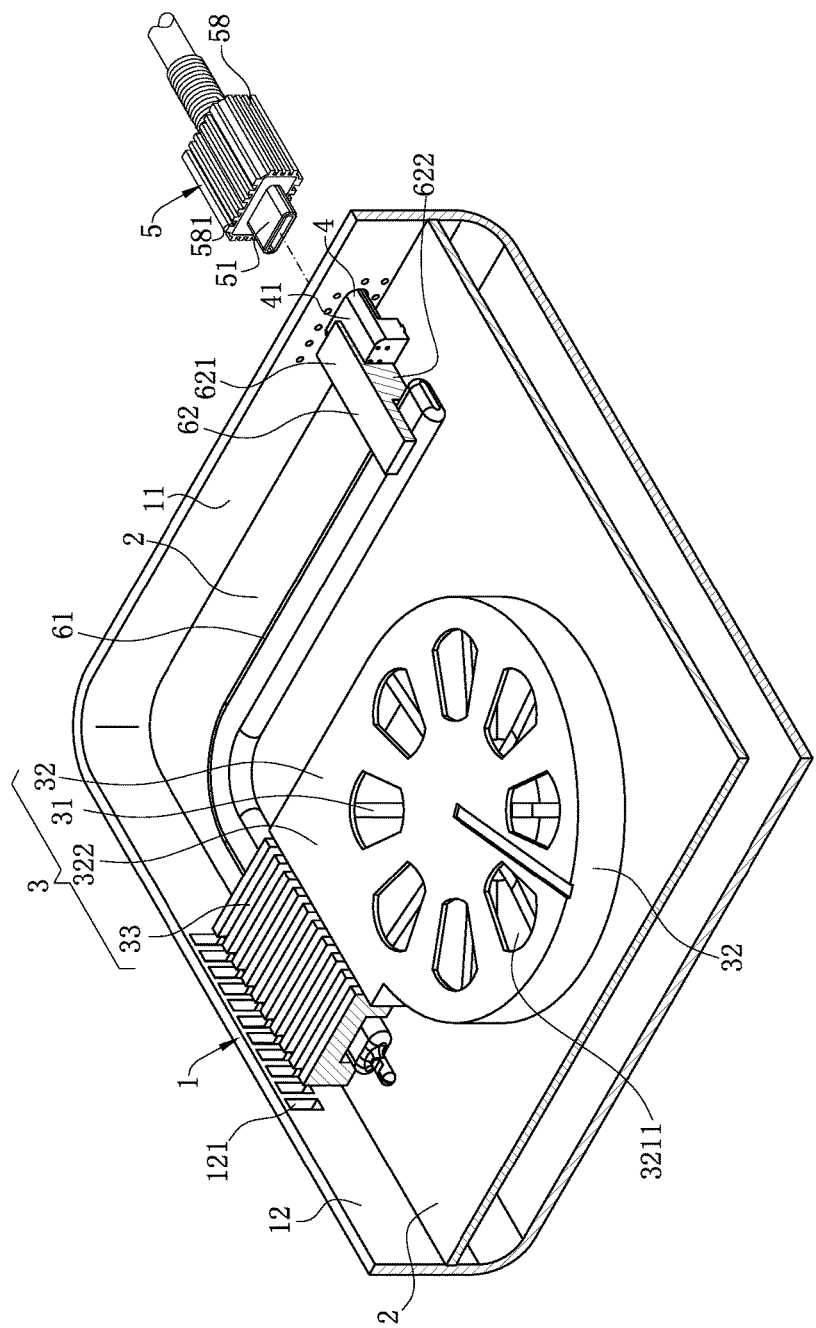
FIG. 2 is a schematic three-dimensional assembly view of the first embodiment of the heat sink assembly according to the present invention.

As shown in FIGS. 1 and 2, a heat sink assembly 100 according to one embodiment of the present invention includes a casing 1, a main board 2 accommodated in the casing 1, a heat sink 3 fixed on the main board 2, an electrical connector 4 accommodated in the casing 1 and soldered onto the main board 2, a mating connector 5 located outside the casing 1 and connected to the electrical connector 4 in a plugging manner, and a heat conducting device 6. The heat conducting device 6 includes a heat conductor 61 and a metal member 62 connected to the heat conductor 61. The heat conducting device 6 is thermally connected to the electrical connector 4 or mating connector 5.

Figure 3:
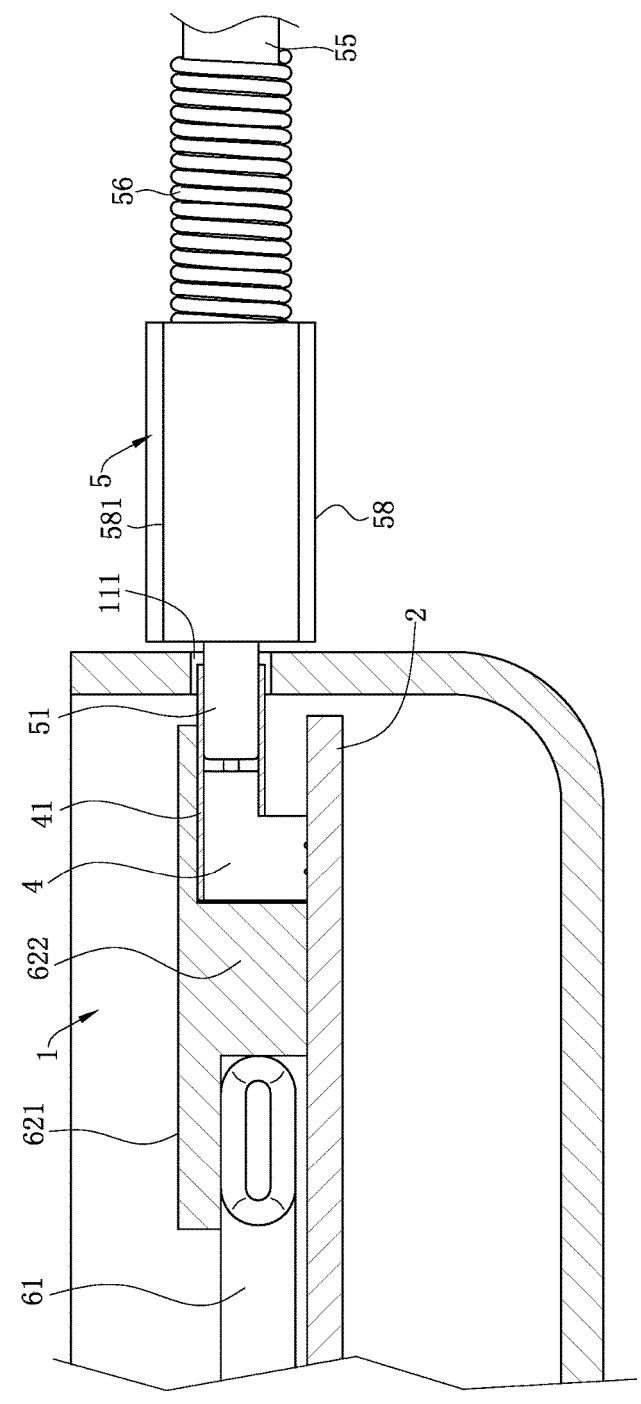
FIG. 3 is a sectional view of the first embodiment of the heat sink assembly according to the present invention.

As shown in FIGS. 1-3, the casing 1 includes a first sidewall 11 and a second sidewall 12 adjacent to the first sidewall 11. The first sidewall 11 is provided with an opening 111. The electrical connector 4 is exposed in the opening 111. The mating connector 5 is inserted to the electrical connector 4 through the opening 111. The second sidewall 12 is provided with a plurality of heat dissipation holes 121, and the heat sink 3 is exposed in the heat dissipation hole 121, so that heat of the heat sink 3 may be dissipated outside the casing 1 through the heat dissipation hole 121.

FIGS. 1-3 show a first embodiment of the present invention. The electrical connector 4 includes an outer shell 41. The outer shell 41 partially covers the mating connector 5. A metal member 62 is accommodated in the casing 1. The metal member 62 includes a top surface 621 and an extending portion 622 formed by extending from the top surface 621 in a direction toward the main board 2. The top surface 621 presses and is in contact with the outer shell 41 and an end of the heat conductor 61. The extending portion 622 is supported on the circuit board 2 and is located at a fixed position between the heat conductor 61 and the electrical connector 4. In this way, heat of the mating connector 5 can be transferred to the electrical connector 4, further be transferred from the electrical connector 4 to the metal member 62, and then be transferred from the metal member 62 to the heat sink 3 through the heat conductor 61, so that a complete thermal conduction path is formed. In this embodiment, in order to ensure a thermal conduction capability of the heat conductor 61, the heat conductor 61 is formed by bending a copper sheet, and in other embodiments, as long as a requirement on a heat conduction rate can be satisfied, the shape and material of the heat conductor 61 are not limited.

As shown in FIGS. 1 and 2, the heat sink 3 includes a fan 31, an air guide member 32 sheathed on the fan 31, and a cooling fin 33. The cooling fin 33 is located on a side of the fan 31 and is pressed on another end of the heat conductor 61, so that the cooling fin 33 can absorb heat transferred from the heat conductor 61, and the fan 31 can also blow air to the cooling fin 33 through the air guide member 32, so as to enable the cooling fin 33 to be rapidly cooled and achieve efficiency of continuously absorbing heat. Further, in order to ensure a heat dissipation rate of the cooling fin 33, the fan 31 directionally blows a sufficient amount of air to the cooling fin 33. The air guide member 32 includes a circular mask portion 321. The mask portion 321 is sheathed on the fan 31. A top surface of the mask portion 321 is provided with eight air inlets 3211. The air inlet 3211 are circularly symmetrically disposed relative to a center of the top surface of the mask portion 321, and widths thereof gradually reduce in a direction of approaching the center of the top surface of the mask portion 321. The fan 31 is provided with eight blades 311, so as to make the number of the air inlets 3211 the same as the number of blades of the fan 31. In this way, not only a requirement on air input of the air inlets 3211 is satisfied, but also strength of the mask portion 321 is ensured. In addition, an air outlet 322 is formed by extending from a side of the mask portion 321 in a direction toward the cooling fin 33, so as to ensure that air output of the fan 31 is directionally blown to the cooling fin 33.

Figure 8:
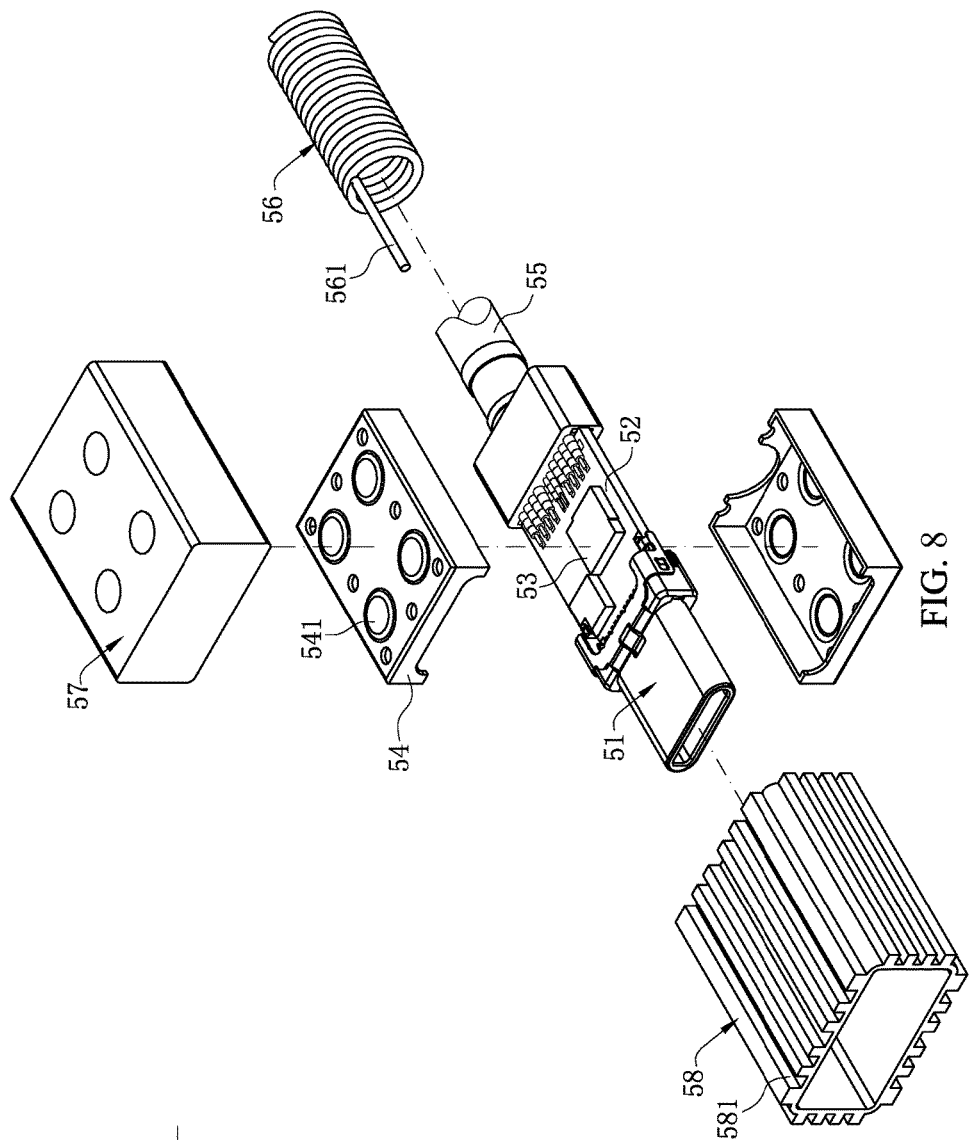
FIG. 8 is a schematic three-dimensional exploded view of a mating connector in the heat sink assembly according to the present invention.
Figure 9:
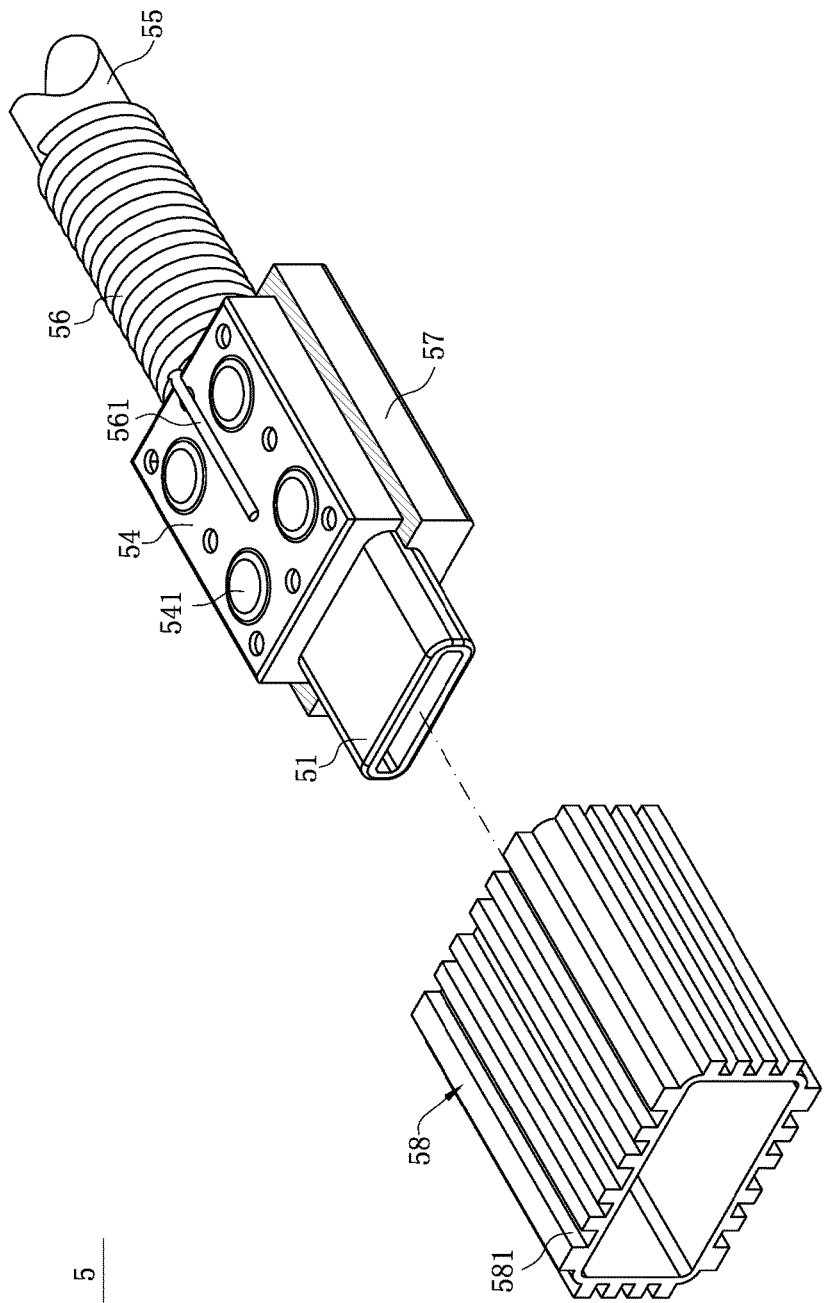
FIG. 9 is a schematic three-dimensional assembly view of a mating connector in the heat sink assembly according to the present invention.

As shown in FIGS. 8 and 9, the mating connector 5 includes a plug 51 for being inserted to the electrical connector 4, a circuit board 52 electrically connected to the plug 51, a chip 53 mounted on the circuit board 52 so as to enable the mating connector 5 to possess a reliable decoding capacity and improve signal transmission efficiency and stability, an inner metal shell 54 covers the circuit board 52 and in contact with the plug 51, a cable 55 soldered to the circuit board 52, and a spring 56 sleeved on an end of the cable 55. One end of the spring 56 extends in a direction toward the inner metal shell 54 to form a heat conducting portion 561. The heat conducting portion 561 is in contact with an outer surface of the inner metal shell 54 and transfers partial heat of the inner metal shell 54 to the spring 56 to dissipate the partial heat into the air, so as to add a heat dissipation path and improve a heat dissipation effect of the mating connector 5. Further, an upper surface and a lower surface of the inner metal shell 54 are respectively provided with four protrusions 541. A plastic shell 57 is formed on a surface of the inner metal shell 54 in an injection molding manner. The protrusion points 541 are exposed on the plastic shell 57. An outer metal shell 58 covers the plastic shell 57 and is in contact with the protrusion points 541, so that partial heat inside the mating connector 5 may be transferred to the outer metal shell 58 through the protrusions 541 for dissipation, another heat dissipation path is provided, and a heat dissipation rate of the mating connector 5 is increased. In order to prevent the outer metal shell 58 from being extremely hot, a surface of the outer metal shell 58 is further provided with a plurality of slots 581, which increases a surface area thereof in contact with the air.

As shown in FIG. 1 and FIG. 2, a wafer may be mounted on the main board 2, and the cooling fin 33 presses and is in contact with the wafer, so as to achieve that the heat sink 3 can dissipate heat simultaneously for the wafer and the mating connector 5 without extra adding the heat sink 3. In this embodiment, the mating connector 5 is a universal serial bus (USB) Type C female terminal that can be plugged in dual orientation, and the electrical connector 4 is a cable connector of a USB Type C male terminal. In other embodiments, types of the electrical connector 4 and the mating connector 5 may be changed according to actual requirements and are not limited herein.

Figure 4:
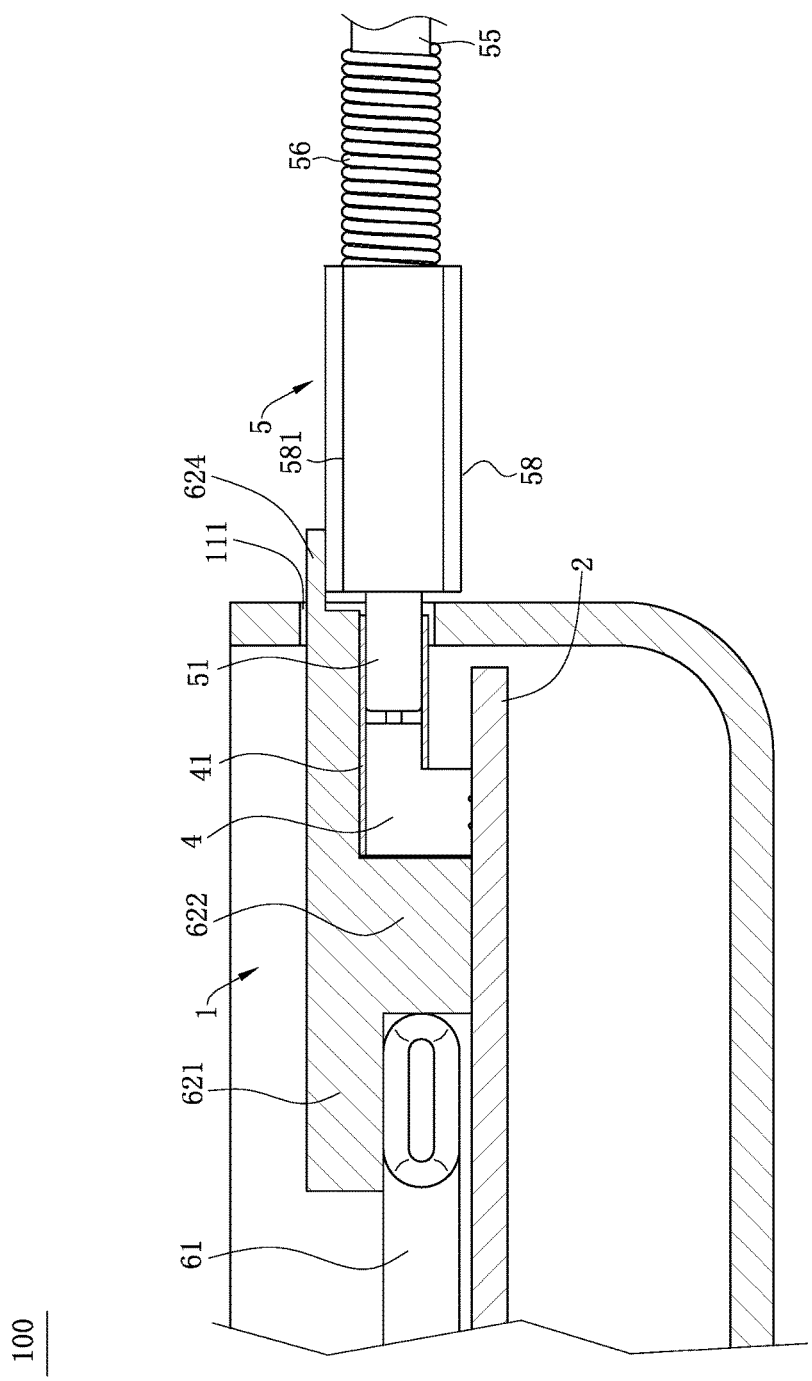
FIG. 4 is a sectional view of a second embodiment of the heat sink assembly according to the present invention.

FIG. 4 shows a second embodiment of the present invention. This embodiment differs from the first embodiment in that the top surface 621 of the metal member 62 extends to from a conductive connecting portion 624 that passes through the opening 111 and extends outside the casing 1, so as to enable the conductive connecting portion 624 to be in contact with the outer metal shell 58 outside the casing 1, thereby accelerating heat removal of the mating connector 5.

Figure 5:
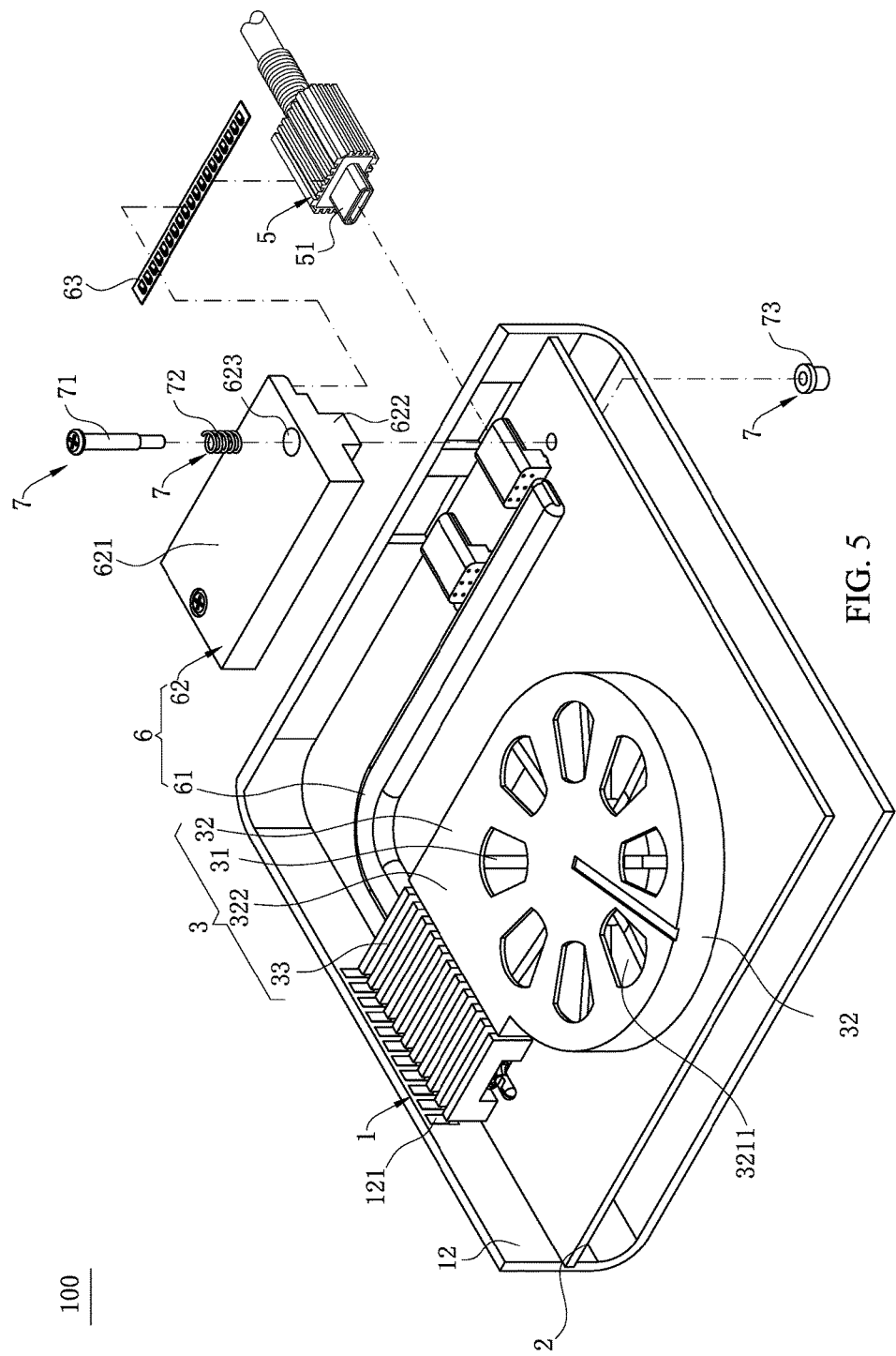
FIG. 5 is a schematic three-dimensional partial exploded view of a third embodiment of the heat sink assembly according to the present invention.
Figure 6:
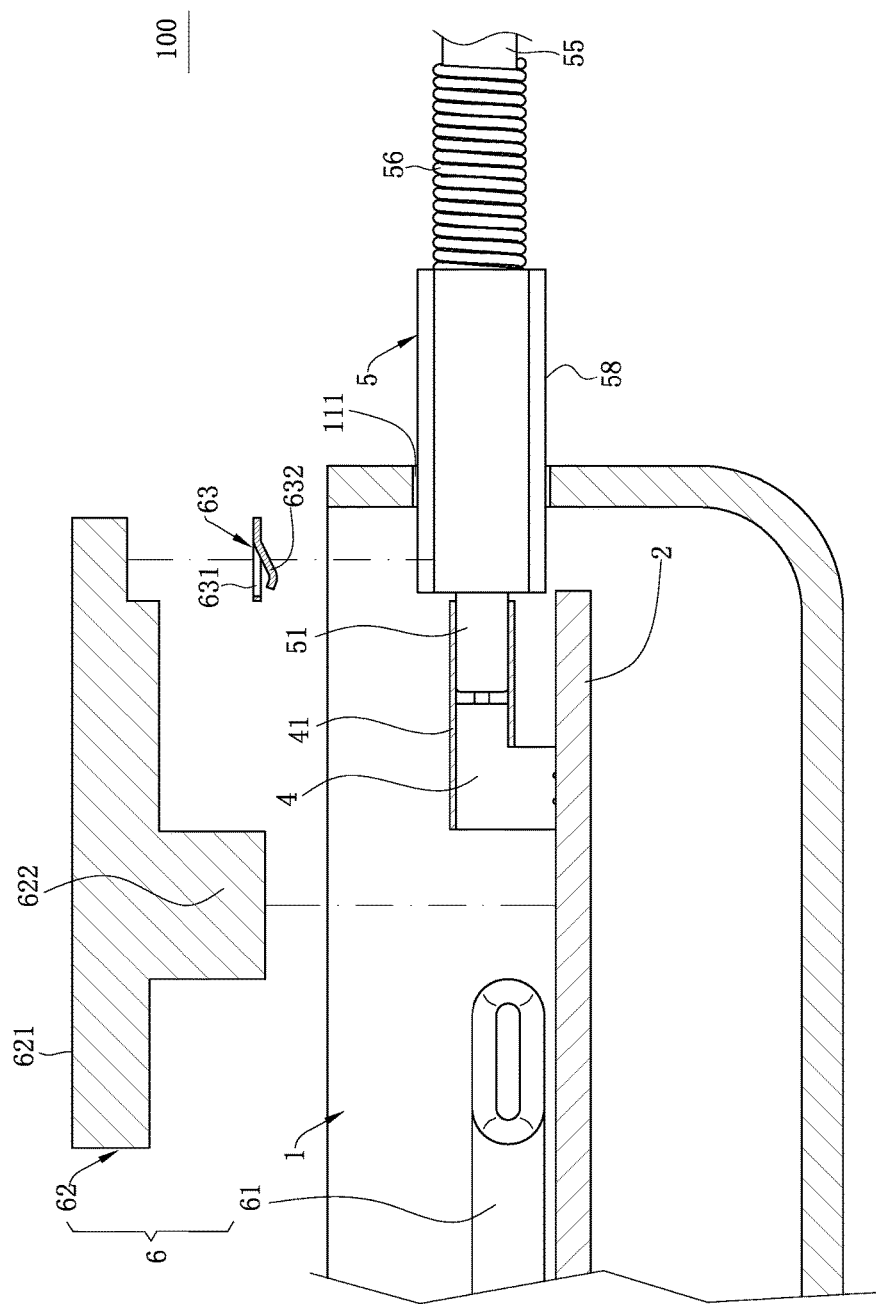
FIG. 6 is a schematic three-dimensional front exploded view of the third embodiment of the heat sink assembly according to the present invention.
Figure 7:
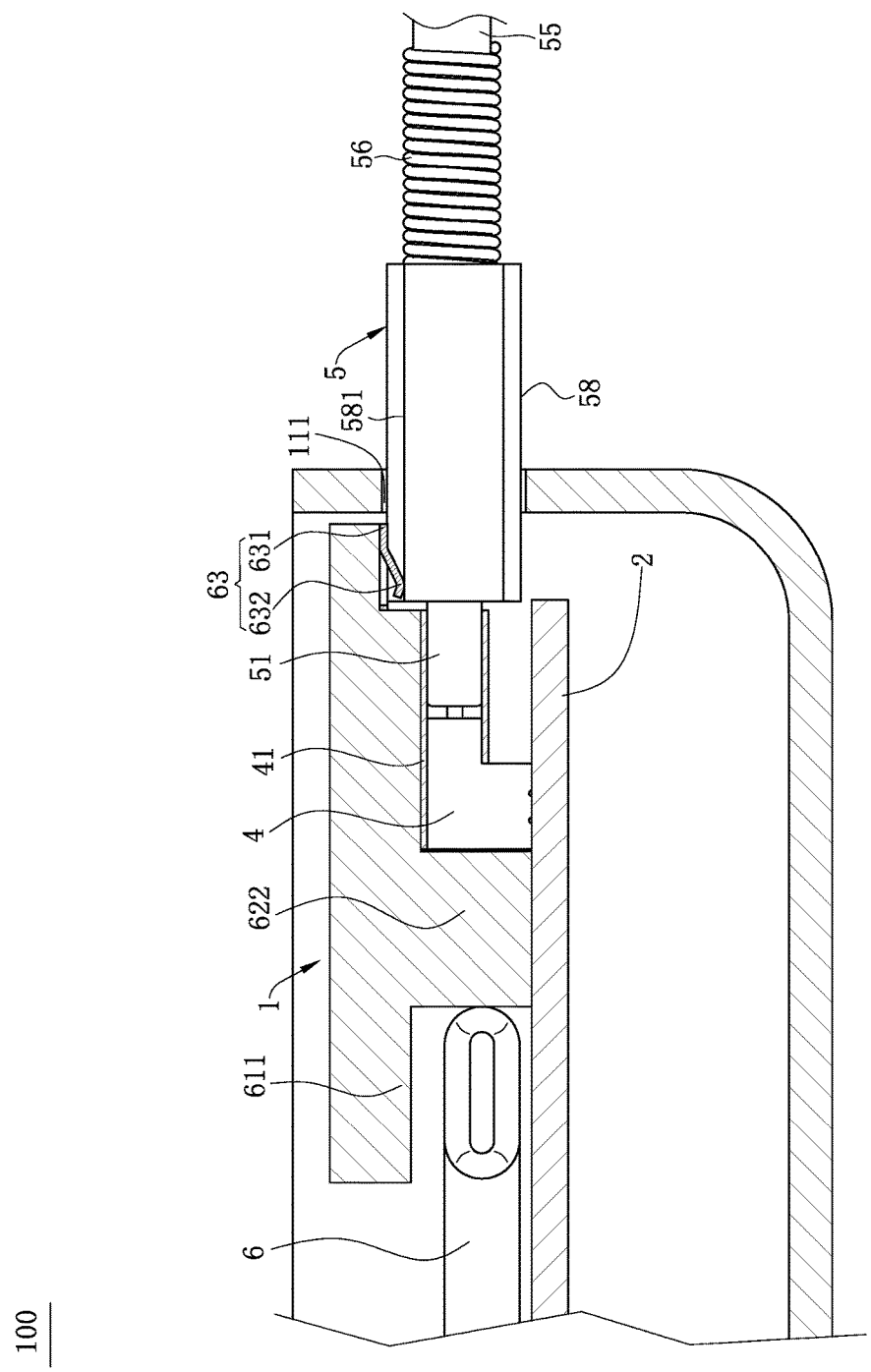
FIG. 7 is a sectional view of the third embodiment of the heat sink assembly according to the present invention.

FIGS. 5-7 show a third embodiment of the present invention. This embodiment differs from the first embodiment in that the outer metal shell 58 partially enters the casing 1 through the opening 111, the heat conducting device 6 further includes an elastic piece 63 soldered onto a surface of the metal member 62 and located above the outer metal shell 58. The elastic piece 63 urges against the outer metal shell 58, so as to prevent the metal member 62 from rigid contact with the outer metal shell 58, ensure connectivity of a whole heat conduction path, and enhance a heat dissipation effect of the mating connector 5. Further, the elastic piece 63 includes a plate portion 631 and an elastic sheet 632 that is torn from the plate portion 631 and that is bent downward. The plate portion 631 tightly covers a surface of the outer metal shell 58, and the elastic sheet 632 enters the one of the slots 581 and urges against bottom surfaces of the slot 581, so as to enhance a contact force between the elastic piece 63 and the outer metal shell 58. In addition, the metal member 62 includes a through hole 623 that penetrates through the top surface 621 and the extending portion 622, and the metal member 62 is locked to the main board 2 through an elastic locking member 7. The elastic locking member 7 includes a bolt 71, an elastic piece 72 sleeved on the bolt 71, and a nut 73 located below the main board 2. The elastic piece 72 is located inside the through hole 623, and the bolt 71 passes through the through hole 623 and the main board 2 to be locked to the nut 73, so as to elastically lock the metal member 62 to the main board 2.

Figure 10:
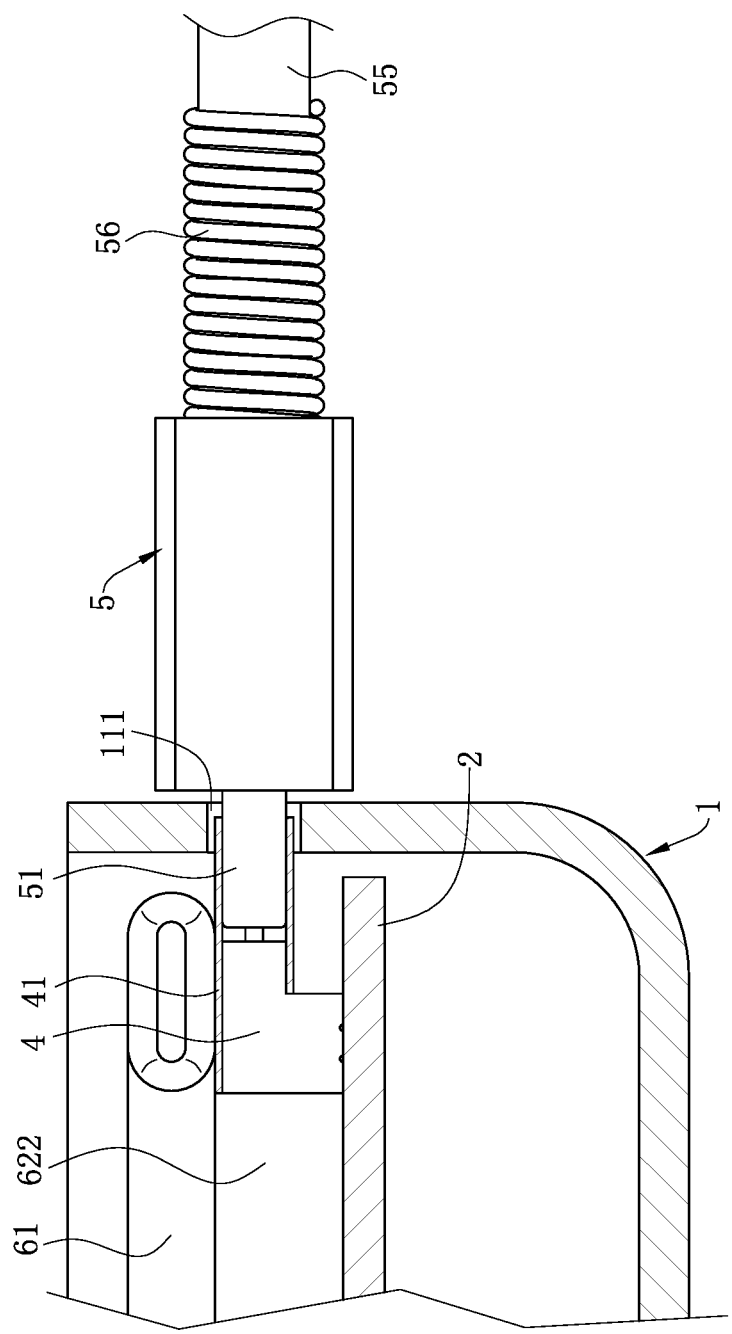
FIG. 10 is a sectional view of a fourth embodiment of the heat sink assembly according to the present invention.
Figure 11A:
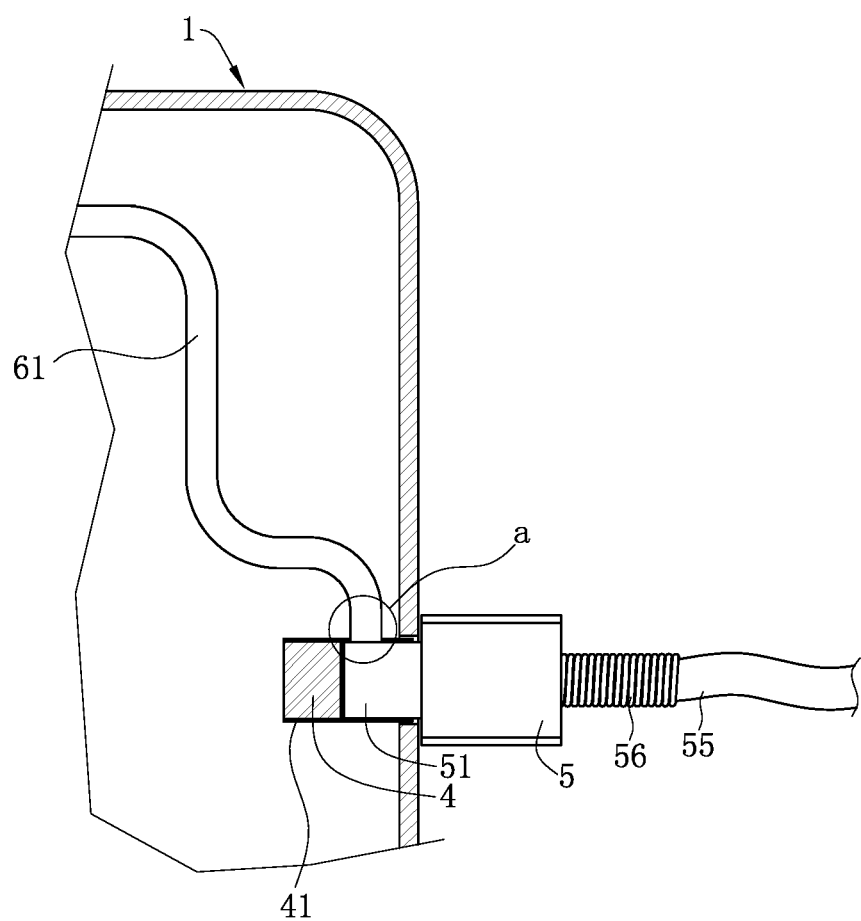
FIG. 11A is a front sectional view of a fifth embodiment of the heat sink assembly according to the present invention.
Figure 11B:
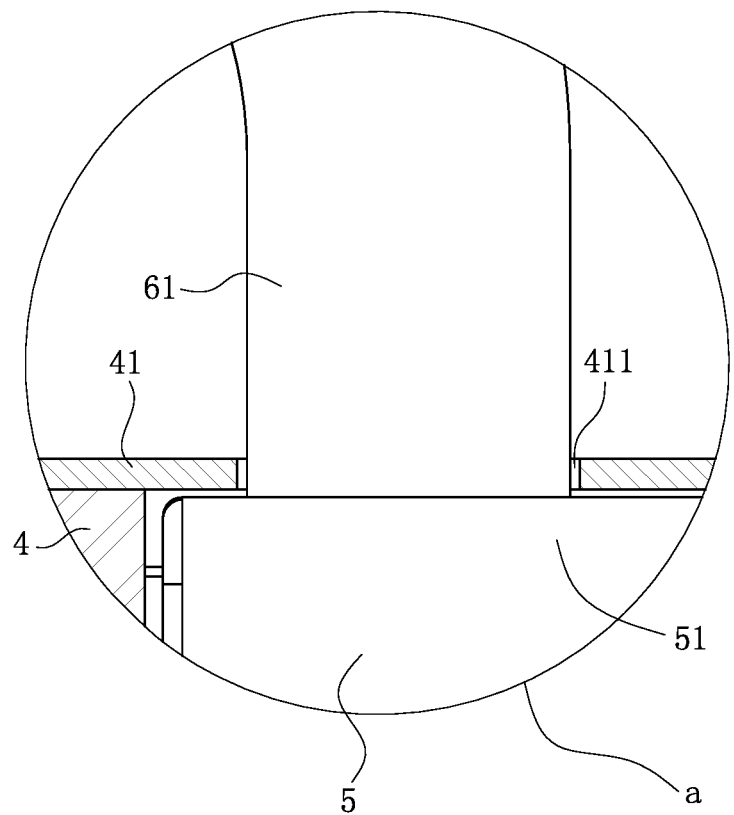
FIG. 11B is a partial enlargement view of part a in FIG. 11A.
Figure 12A:
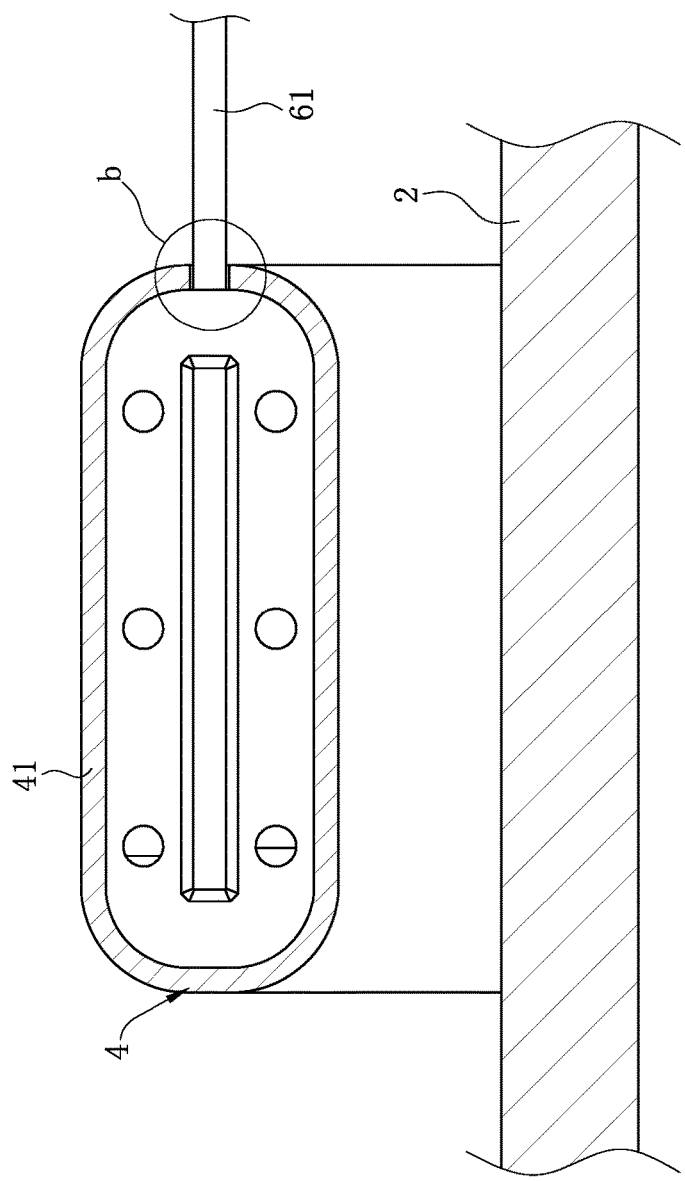
FIG. 12A is a sectional view of the fifth embodiment of the heat sink assembly viewed along a plugging direction according to the present invention.
Figure 12B:
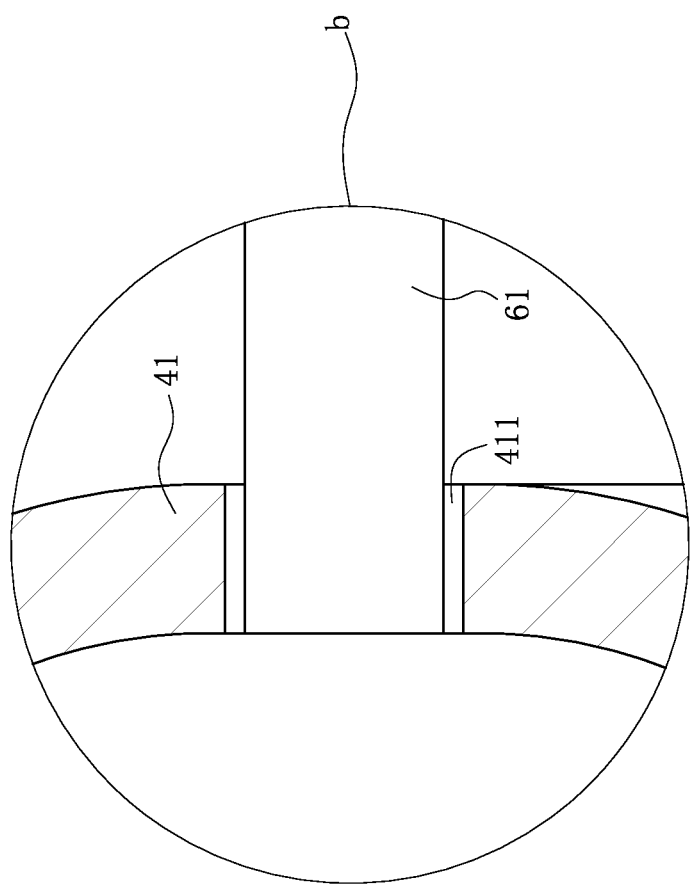
FIG. 12B is a partial enlargement view of part b in FIG. 12A.

FIG. 10 shows a fourth embodiment of the present invention. This embodiment differs from the first embodiment in that the heat conductor 61 directly covers the outer shell 41 of the electrical connector 4 to form a heat conduction path.

FIGS. 11A, 11B, 12A and 12B show a fifth embodiment of the present invention. In this embodiment, the outer shell 41 of the electrical connector 4 is provided with a notch 411, the plug 51 is exposed in the notch 411, the heat conductor 61 is in direct contact with the plug 51 through the notch 411, and heat generated by the mating connector 5 during working is directly transferred to the heat sink 3.

Figure 13:
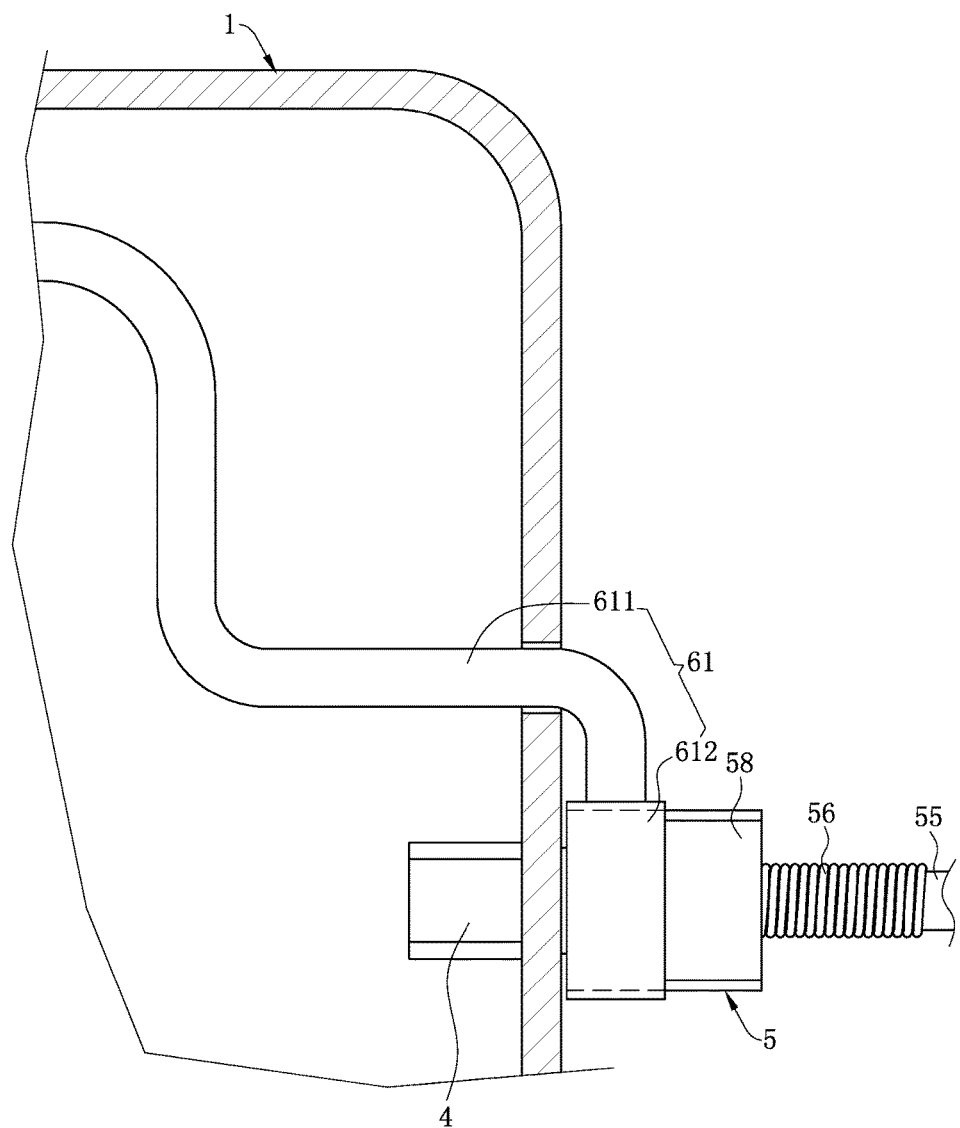
FIG. 13 is a front sectional view of a sixth embodiment of the heat sink assembly according to the present invention.
Figure 14:
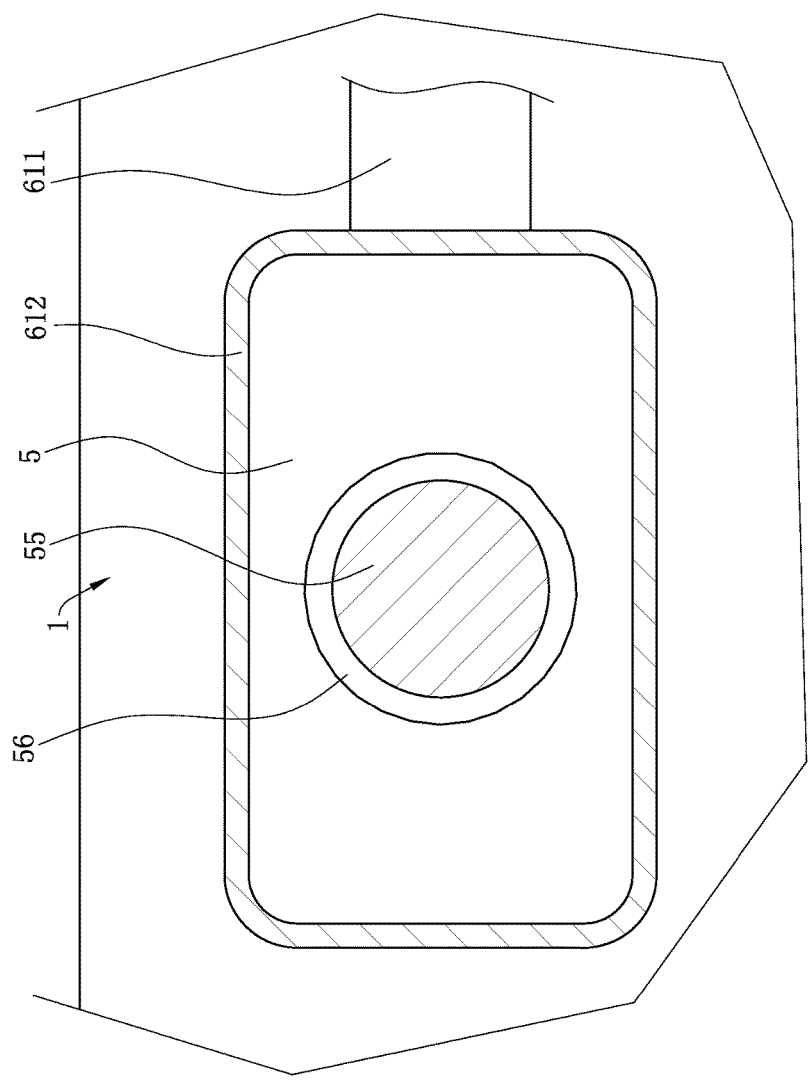
FIG. 14 is a sectional view of the sixth embodiment of the heat sink assembly viewed along a plugging direction according to the present invention.

FIGS. 13 and 14 show a sixth embodiment of the present invention. In this embodiment, the heat conductor 61 includes a conducting portion 611, an end of the conducting portion 611 presses and is in contact with the heat sink 3, and another end thereof extends outside the casing 1 to form open frame portion 612. The open frame portion 612 tightly covers the outer metal shell 58, increases an area of contact between the heat conductor 61 and the mating connector 5, and improves heat conduction efficiency.

In summary, the heat sink assembly 100 according to certain embodiments of the present invention has the following beneficial advantages:

(1) One end of the heat conductor 61 is connected to the heat sink 3, and the other end thereof is thermally connected to the mating connector 5, so that heat generated by the mating connector 5 during working can be transferred to the heat sink through the heat conductor 61 for dissipation, so as to prevent a temperature of the mating connector 5 from being extremely high and ensure normal working of the chip 53 in the mating connector 5.

(2) The metal member 62 bridges the electrical connector 4 and the heat conductor 61, so as to increase an area of contact between the heat conductor 61 and the electrical connector 4 and improve stability of a thermal conduction path.

(3) The heat conducting portion 561 provided on the spring 56 is in contact with the inner metal shell 54, so as to add a heat dissipation path.

(4) The outer metal shell 58 is in contact with the protrusion 541, so as to provide another heat dissipation path.

(5) A surface of the outer metal shell 58 is provided with a plurality of slots 581, which increases a surface area of the outer metal shell 58 and increases a heat dissipation rate of the mating connector 5.

(6) The elastic sheet 632 urges against the outer metal shell 58, so as to prevent the metal member 62 from rigid contact with the outer metal shell 58, ensure connectivity of a whole heat conduction path, and enhance a heat dissipation effect of the mating connector 5.

(7) The heat conductor 61 transfers heat of the mating connector 5 to the heat sink 3 of the wafer (not shown in the drawing), so as to improve use efficiency of the heat sink 3, thereby avoiding inconvenience of extra adding one said heat sink 3 and saving costs.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A heat sink assembly, comprising:
a casing having an opening;
a main board accommodated in the casing;
a heat sink mounted on the main board;
an electrical connector, mounted on the main board and exposed in the opening;
a mating connector, located outside the casing, connected to the electrical connector through the opening in a plugging manner, and comprising a chip that is electrically connected to the electrical connector; and
a heat conducting device disposed inside the casing, wherein one end of the heat conducting device is connected to the heat sink, and another end of the heat conducting device is in contact with the electrical connector or the mating connector, so that heat generated by the chip during working can be transferred to the heat sink through the heat conducting device, thereby reducing a temperature of the mating connector.

2. The heat sink assembly of claim 1, wherein the heat conducting device comprises a heat conductor and a metal member connected to the heat conductor, and a side of the metal member is in contact with the electrical connector.

3. The heat sink assembly of claim 2, wherein the metal member comprises a top surface and an extending portion extending from the top surface toward the main board, the top surface presses and is in contact with the electrical connector and the heat conductor, and the extending portion is supported on the main board and is located between the heat conductor and the electrical connector.

4. The heat sink assembly of claim 1, wherein the electrical connector comprises an outer shell, the outer shell partially encloses the mating connector, and the heat conducting device clings to the outer shell.

5. The heat sink assembly of claim 1, wherein the electrical connector comprises an outer shell, the outer shell has a notch, the mating connector is exposed in the notch, and the heat conducting device is in contact with the mating connector through the notch.

6. The heat sink assembly of claim 1, wherein the heat conducting device comprises a conducting portion, one end of the conducting portion presses the heat sink, another end of the conducting portion extends to form an open frame portion, the open frame portion is located outside the casing and surrounds the opening, the mating connector comprises an outer metal shell, and the open frame portion tightly encloses the outer metal shell.

7. The heat sink assembly of claim 1, wherein the mating connector comprises an outer metal shell enclosing the chip, and the outer metal shell partially enters the casing through the opening and is conductively connected to the heat conducting device.

8. The heat sink assembly of claim 1,
wherein the mating connector comprises an outer metal shell enclosing the chip;
wherein the heat conducting device comprises a heat conductor connected to the heat sink, a metal member connected to the heat conductor, and an elastic piece mounted on a surface of the metal member; and
wherein the elastic piece is located between the metal member and the outer metal shell and urges downward against the outer metal shell.

9. The heat sink assembly of claim 8, wherein the elastic piece comprises a plate portion clinging to a surface of the outer metal shell, and an elastic sheet formed from the plate portion in a tearing and bending manner, the surface of the outer metal shell is provided with a plurality of slots, and the elastic sheet enters one of the slots and urges against bottom surfaces of the slot.

10. The heat sink assembly of claim 1, wherein the mating connector comprises an outer metal shell enclosing the chip, the heat conducting device comprises a conductive connecting portion that passes through the opening, and the conductive connecting portion is in contact with the outer metal shell.

11. The heat sink assembly of claim 1, wherein the mating connector comprises a plug and a circuit board connected to the plug, the plug is connected to the electrical connector in a plugging manner, the chip is mounted on the circuit board, an inner metal shell covers the circuit board and is in contact with the plug, a cable is soldered to the circuit board, a spring is sleeved on an end of the cable, an end of the spring extends toward the inner metal shell to form a heat conducting portion, and the heat conducting portion is in contact with an outer surface of the inner metal shell.

12. The heat sink assembly of claim 11, wherein the outer surface of the inner metal shell is provided with at least one protrusion, an outer metal shell encloses the inner metal shell, an inner surface of the outer metal shell is in contact with the protrusion, and an outer surface of the outer metal shell is provided with a plurality of slots.

13. The heat sink assembly of claim 1, wherein the heat conducting device is formed by bending a copper tube, the casing comprises a first sidewall and a second sidewall adjacent to the first sidewall, the opening is located on the first sidewall, the second sidewall is provided with a plurality of heat dissipation holes, and the heat sink is exposed in the heat dissipation holes.

14. The heat sink assembly of claim 1,
wherein the heat sink comprises a fan, an air guide member covering the fan, and a cooling fin; and
wherein the cooling fin is located on a side of the fan and presses the heat conducting device, the fan blows air to the cooling fin through the air guide member, the air guide member is provided with a mask portion that is circular, the mask portion covers on the fan, a top surface of the mask portion is provided with a plurality of air inlets, an air outlet is formed by extending from a side of the mask portion in a direction adjacent to the cooling fin, the air inlets are circularly symmetrically disposed relative to a center of the top surface of the mask portion, widths of the air inlets gradually reduce in a direction toward the center of the top surface of the mask portion, and a number of the air inlets is the same as a number of blades of the fan.

15. A heat sink assembly, comprising:
a casing having an opening;
a main board accommodated in the casing;
an electrical connector mounted on the main board and exposed in the opening;
a mating connector, at least partially disposed inside the casing, connected to the electrical connector through the opening in a plugging manner, and comprising a chip that is electrically connected to the electrical connector; and
a heat conducting device, in contact with the electrical connector or the mating connector, so that heat generated by the chip during working can be transferred into the casing through the heat conducting device, thereby reducing a temperature of the mating connector.

16. The heat sink assembly of claim 15, wherein the mating connector comprises an outer metal shell enclosing the chip, the heat conducting device is located inside the casing, and the outer metal shell partially enters the casing through the opening and is in contact with the heat conducting device.

17. The heat sink assembly of claim 15, wherein the heat conducting device comprises an elastic piece, and the elastic piece urges against the electrical connector or the mating connector.

18. The heat sink assembly of claim 17, wherein the mating connector comprises an outer metal shell enclosing the chip, the heat conducting device comprises a heat conductor and a metal member connected to the heat conductor, and the elastic piece is mounted on the metal member and urges against the outer metal shell.

19. The heat sink assembly of claim 18, wherein the elastic piece comprises a plate portion clings to a surface of the outer metal shell, and an elastic sheet formed from the plate portion in a tearing and bending manner, the surface of the outer metal shell is provided with a plurality of slots, and the elastic sheet enters one of the slots and urges against bottom surfaces of the slot.

20. The heat sink assembly of claim 15, wherein the mating connector comprises an outer metal shell enclosing the chip, the mating connector comprises a conductive connecting portion that passes through the opening and is in contact with the outer metal shell outside the casing.

21. The heat sink assembly of claim 15, further comprising an elastic locking member, wherein the elastic locking member comprises a bolt, an elastic body sheathed on the bolt, and a nut located below the main board, the heat conducting device comprises a through hole, the elastic body is located inside the through hole, and the elastic bolt passes through the through hole and the main board and is locked to the nut.

22. The heat sink assembly of claim 15, further comprising a heat sink mounted on the main board or the casing, wherein the heat sink is connected to the heat conducting device, so that the heat generated by the chip during the working can be transferred to the heat sink through the heat conducting device.

* * * * *